United States Patent
Miles et al.

(10) Patent No.: US 11,342,489 B2
(45) Date of Patent: May 24, 2022

(54) METHOD OF SURFACE-MOUNTING COMPONENTS

(71) Applicant: DST Innovations Limited, Bridgend (GB)

(72) Inventors: Anthony Miles, Bridgend (GB); Benjamin Masheder, Portishead (GB)

(73) Assignee: DST Innovations Limited, Bridgend (GB)

( * ) Notice: Subject to any disclaimer, the term of this patent is extended or adjusted under 35 U.S.C. 154(b) by 0 days.

(21) Appl. No.: 15/739,346

(22) PCT Filed: Jun. 23, 2016

(86) PCT No.: PCT/GB2016/051884
§ 371 (c)(1),
(2) Date: Dec. 22, 2017

(87) PCT Pub. No.: WO2016/207640
PCT Pub. Date: Dec. 29, 2016

(65) Prior Publication Data
US 2018/0182944 A1    Jun. 28, 2018

(30) Foreign Application Priority Data

Jun. 24, 2015  (GB) .................................... 1511098
Dec. 3, 2015   (GB) .................................... 1521353

(51) Int. Cl.
*H01L 33/62*      (2010.01)
*H01L 23/544*     (2006.01)
(Continued)

(52) U.S. Cl.
CPC .......... *H01L 33/62* (2013.01); *H01L 21/6835* (2013.01); *H01L 21/6836* (2013.01);
(Continued)

(58) Field of Classification Search
CPC ....... H01L 25/0753; H01L 2224/81005; H01L 2224/83005; H01L 23/4985; H01L 23/5384; H01L 21/6835
See application file for complete search history.

(56) References Cited

U.S. PATENT DOCUMENTS 6,083,768 A     7/2000  Jiang et al.
6,693,384 B1 *  2/2004  Vicentini ............ G02F 1/13452
                                                   257/668
(Continued)

FOREIGN PATENT DOCUMENTS

CN    102473654 A    5/2012
CN    102656674 A    9/2012
(Continued)

OTHER PUBLICATIONS

International Search Report of the International Searching Authority dated Sep. 29, 2016, issued in connection with International Application No. PCT/GB2016/051884 (4 pages).

(Continued)

*Primary Examiner* — Stephen M Bradley
(74) *Attorney, Agent, or Firm* — McCarter & English, LLP

(57) ABSTRACT

A method of connecting a plurality of electronic components to a flexible circuit board comprises: providing a carrier substrate carrying the electronic components, each of the electronic components having at least one electrical contact coated with electrically conductive adhesive; and applying the carrier substrate to the flexible circuit board such that the electronic components are adhered to the flexible circuit board in electrical contact therewith via the conductive adhesive. The electronic components may comprise LEDs and there may be provided one or more optical layers over the flexible circuit board.

12 Claims, 5 Drawing Sheets

(51) Int. Cl.
    *H01L 21/683*    (2006.01)
    *H01L 23/00*     (2006.01)
    *H01L 23/538*    (2006.01)
    *H05K 3/00*     (2006.01)
    *H05K 1/18*     (2006.01)
    *H05K 3/32*     (2006.01)
    *H01L 33/00*     (2010.01)
    *H01L 33/58*     (2010.01)
    *H01L 23/498*    (2006.01)
    *H01L 25/075*    (2006.01)

(52) U.S. Cl.
    CPC ........ *H01L 23/5387* (2013.01); *H01L 23/544* (2013.01); *H01L 24/32* (2013.01); *H01L 24/83* (2013.01); *H01L 33/0093* (2020.05); *H01L 33/58* (2013.01); *H05K 1/189* (2013.01); *H05K 3/007* (2013.01); *H05K 3/323* (2013.01); *H01L 23/4985* (2013.01); *H01L 25/0753* (2013.01); *H01L 2221/68318* (2013.01); *H01L 2221/68354* (2013.01); *H01L 2221/68363* (2013.01); *H01L 2221/68368* (2013.01); *H01L 2221/68381* (2013.01); *H01L 2223/5442* (2013.01); *H01L 2223/54426* (2013.01); *H01L 2223/54486* (2013.01); *H01L 2224/27003* (2013.01); *H01L 2224/32225* (2013.01); *H01L 2224/32227* (2013.01); *H01L 2224/83005* (2013.01); *H01L 2224/83132* (2013.01); *H01L 2224/83192* (2013.01); *H01L 2224/83203* (2013.01); *H01L 2224/83851* (2013.01); *H01L 2224/83855* (2013.01); *H01L 2224/97* (2013.01); *H01L 2924/12041* (2013.01); *H01L 2933/0058* (2013.01); *H01L 2933/0066* (2013.01); *H05K 2203/1545* (2013.01); *H05K 2203/166* (2013.01)

(56) References Cited

U.S. PATENT DOCUMENTS

| | | | |
|---|---|---|---|
| 7,029,960 | B2 | 4/2006 | Hashimoto et al. |
| 9,651,231 | B2 | 5/2017 | Veerasamy |
| 2004/0026033 | A1 | 2/2004 | Price et al. |
| 2004/0195569 | A1* | 10/2004 | Hashimoto ......... H01L 27/1214 257/69 |
| 2008/0108181 | A1 | 5/2008 | Chan et al. |
| 2008/0122119 | A1* | 5/2008 | Kian ................. H01L 24/90 257/783 |
| 2009/0130607 | A1* | 5/2009 | Slater .................... B82Y 10/00 430/323 |
| 2012/0085579 | A1* | 4/2012 | Tatsuzawa ............... H01B 1/22 174/84 R |
| 2012/0097313 | A1 | 4/2012 | Odawara et al. |
| 2012/0313241 | A1 | 12/2012 | Bower |
| 2013/0026511 | A1* | 1/2013 | Yeh .................... H01L 25/0753 257/89 |
| 2014/0084482 | A1* | 3/2014 | Hu ......................... H01L 24/06 257/774 |
| 2014/0098557 | A1 | 4/2014 | Veerasamy |
| 2014/0120356 | A1 | 5/2014 | Shearer et al. |
| 2016/0240516 | A1* | 8/2016 | Chang ................. H01L 25/0753 |

FOREIGN PATENT DOCUMENTS

| | | |
|---|---|---|
| CN | 102668065 A | 9/2012 |
| DE | 102006012708 A1 | 9/2007 |
| EP | 562571 A2 | 9/1993 |
| JP | 2004-186263 A | 7/2004 |
| JP | 2005129757 A | 5/2005 |
| WO | 9827178 A1 | 6/1998 |
| WO | 2007/107299 A1 | 9/2007 |
| WO | 2013146888 A1 | 10/2013 |
| WO | 2016152543 A1 | 9/2016 |

OTHER PUBLICATIONS

Written Opinion of the International Searching Authority dated Sep. 29, 2016, issued in connection with International Application No. PCT/GB2016/051884 (7 pages).
Combined Search and Examination Report dated Jan. 21, 2016, issued in connection with UK Patent Application Mo. GB 1511098.4 (5 pages).
Examination Report dated Oct. 10, 2017, issued in connection with UK Patent Application No. GB 1511098.4 (4 pages).
Combined Search and Examination Report dated Jun. 17, 2016, issued in connection with UK Patent Application No. GB 1521353.1 (2 pages).
Examination Report dated Mar. 26, 2019, issued in connection with UK Patent Application No. GB 1521353.1 (1 page).
European Office Action dated Jul. 3, 2020, issued in connection with European Patent Application No. 16744831.5 (6 pages).
Chinese Office Action dated Jul. 30, 2020, issued in connection with Chinese Patent Application No. 2016800492206.8, and English translation thereof (18 pages).
Chinese Office Action dated Mar. 29, 2021, issued in connection with Chinese Patent Application No. 2016800492206.8, and English translation thereof (14 pages).

* cited by examiner

METHOD OF SURFACE-MOUNTING COMPONENTS

RELATED APPLICATIONS

This application is a U.S. National Phase Application under 35 U.S.C. 371 of International Application No. PCT/GB2016/051884 filed Jun. 23, 2016, which claims the benefit of priority to United Kingdom (Great Britain) Patent Application No. 1511098.4 filed on Jun. 24, 2015 and to United Kingdom (Great Britain) Patent Application No. 1521353.1 filed on Dec. 3, 2015. The entire disclosures of the foregoing applications are incorporated by reference herein.

FIELD OF THE INVENTION

The present invention relates to a method of surface-mounting components, particularly but not exclusively for forming flexible electronic devices on flexible substrates.

BACKGROUND OF THE INVENTION

The following discussion is not to be taken as an admission of relevant prior art.

The joining of surface mount components to electronic circuits is typically achieved by using a metallic solder to create electrical connections between the electrodes, followed by a polymer "glue" to help bond the component to the surface of the circuit. However, the rise in application of flexible electronic circuits and devices has meant that many more electronic devices are being created on flexible substrates such as polymer sheets and fabric, which are not compatible with the high temperatures required for soldering and the rigidity of the soldered joints. For instance, solder paste typically requires temperatures in excess of 200° C. to cure, making soldering incompatible with common flexible substrate like polyethylene terephthalate (PET) and polyvinyl chloride (PVC), which possess softening points around 70° C. and 55° C., respectively. This unsuitability has meant that other electronic joining techniques have to be used to create flexible electronic devices with integrated surface mounted components.

In contrast to solder paste, which is typically a low temperature melting metal alloy, polymer binders packed with conductive materials (conductive binders) largely cure at temperatures lower than 150° C., or at room temperature by application of ultraviolet light. For this reason conductive adhesives have begun to be used to create flexible electronics; they are also often relatively cheap and flexible whilst also providing good electrical conductivity and adhesion. Conductive adhesives exist in two general classes, isotropic conductive adhesives (ICAs) and anisotropic conductive adhesives (ACAs). ICAs are capable of conducting in all directions while ACAs conduct only in the z-axis when compressed between electrodes. Another useful capacity of conductive adhesives is their ability to be rapidly printed in large areas or patterns using common printing techniques such as screen printing, allowing shorter processing times.

The rise of interest in flexible electronics is presently limited by the need for development and availability of new materials and processing techniques that will allow flexible circuitry and therefore flexible devices to work in the same manner and be as durable and economical to produce as their rigid counterparts. Flexible electronics may find application in wearable devices, such as health monitoring sensors embedded within the fabric of normal clothing, or flexible lighting and signage that can move and fit within any environment. For ideas such as these to be realized there needs to be a movement away from rigid components and greater innovation of the processing techniques used in the production of such devices to make them as cheap or cheaper than their rigid bodied counterparts. For instance, it is not acceptable for solid wiring to be used to create electronic connections in textile fabrics because the stiff nature of typical metal wires would not allow the fabric to move and feel like "normal" textile fabric. Similarly, the creation of new circuit designs with control chips and other integrated components are typically quickly and cheaply done for traditional rigid electronics by printed circuit board prototyping companies or by creation of bulky breadboards. However, such a system of prototyping control circuits and component arrays is not available in most cases to flexible electronics companies.

There are a number of methods for forming flexible multi-component electronic devices described in patent literature. One example is described in US-A-2014/0098557, which describes the production of laminated LED arrays connected by "flexible wires". However, the approach described requires each LED and connector to be separately placed onto the flexible substrate, resulting in a highly labour intensive process that is not suitable for economical high throughput production.

Another example of the creation of a flexible electronic device that contains rigid components can be found in US-A-2004/0026033, which describes the use of conductive adhesives, or more specifically ACAs to attach microchips to flexible substrates that have been pre-printed with a flexible electronic circuit design. The approach uses commercial pick and place machines to place flip chip devices at the required locations before pressure and heat are applied to attach the chips to the circuit. While this approach is suitable for some uses, it is necessary to use a pick and place machine rather than a typical flip chip assembly unit which is commonly designed to place a component in the same position each time. This reliance on pick and place machines is very limiting to the production speed and related inflated costs. Pick and place machines are typically only able to deposit around 3,000 items per hour, which is not sufficient or economically viable for high-throughput industrial production of devices containing a large number or large array of components. Typically in such cases the problem of limiting pick and place machine speeds is "solved" by adding more pick and place machines into a production line; however this approach is naturally highly expensive and space limiting.

One application of flexible devices is in the production of uniform light sources. Uniform light sources have found use in many areas of modern life such as room lighting, and rear illumination of posters and signs. The majority of commercial and domestic light sources use old, inefficient and rigid light emitting devices such as fluorescent tubes and filament bulbs. The environmental impact of such light sources is very poor because for instance fluorescent bulbs contain highly poisonous mercury and the high power consumption of these traditional light sources is poor by modern standards. LEDs offer significant advantages over fluorescent tubes and filament bulbs due to their lower power consumption, increased lifetime and enhanced environmental properties. LEDs are commonly used in a number of display devices such as flat screen televisions and small displays where they are pick-and-placed onto rigid PCBs (printed circuit boards) and soldered into place. Current methods of creating uniform light involve back reflection of side mounted LEDs through a rigid diffuser sheet.

EP-A-2717313 discloses a method of producing a large area LED lighting device, in which LEDs are embedded directly into beads that are then coated onto a substrate. This process requires the embedding of LEDs into beads directly, which are then processed so as to be sandwiched between two conductive substrates. The process is not suitable for current printing methodologies, and does not allow for the use of non-metallic bottom substrates. The coating of the LEDs on to the substrate results in a non-uniform, non-regular rotation of the LEDs, therefore not affording patterning properties.

US-A-20150204490 discloses a printed, flexible, large area device, containing LEDs and a light scattering mechanism. The LEDs are printed microscopic LEDs, as disclosed in US-A-20120164796, rather than standard commercially available LEDs. The process requires two separated conductive layers, resulting in the need for an optically transparent conductive layer. Diffuse particles comprising metal oxides are used.

SUMMARY OF THE INVENTION

Aspects of the invention are defined by the accompanying claims.

According to one embodiment of the invention, there is provided a method for forming pre-configured arrays of surface mounted electronic components. The method comprises the attachment of electronic components to a flexible substrate in a specifically spaced arrangement which corresponds to where they are required on the finished circuit design of the surface mounted device. Advantageously, at this first step of processing, a binding material comprising an anisotropic conductive adhesive is attached to the electrodes of the surface mount electronic components. This pre-configured array of components is then able to be quickly and easily transferred to a printed electronic circuit on a final substrate using uniform pressure and low temperature or ultraviolet light without the need for high temperature techniques such as soldering or time intensive techniques such as pick and place machines.

Using embodiments of the invention, it is possible to speed up the deposition of surface mounted components onto flexible printed electronic circuits by removing the need for on-site/in-line pick and place machines. Pre-organizing components on a flexible backing in an arrangement in which they are required allows all the components to be deposited onto a circuit in one step. This can be much faster than using pick and place machines and may allow components to be simultaneously placed on a device circuit. For this application it is envisaged that conductive adhesives or more advantageously anisotropic conductive adhesives (ACAs) may be used as both electronic joining materials and adhesives to bind the components to the surface of the printed electronic circuit. It is also envisaged that the conductive adhesives may be printed onto a first substrate in the desired amount and pattern and that the connectors of the components may then be placed into the conductive adhesive pads. Following this a second substrate or carrier substrate with a thermal release adhesive may be applied to the top side of the components. This second substrate may firstly act to protect the components and to make sure that they do not move from their required positions. It is then envisaged that these arrays of components may be applied directly to pre-printed electronic circuits by first removing the flexible backing, exposing the ACA-coated underside of the components. Then using optical registration mark or punched alignment holes the component array is aligned with the pre-printed circuit pattern and using heat and pressure the components are electrically and physically joined. When the ACA is cured, the heat of the ACA curing step may allow the thermal release adhesive to release the second substrate, leaving the finished circuit containing all components. In this way it is possible to overcome the limitations of in-line pick and place machines and allow the fast and economic production of flexible electronic devices.

Using methods of embodiments of the invention it is possible to populate a flexible electronic device by pre-placing LEDs and other components temporarily onto a flexible thermal release liner in as-required arrays, then transferring the components to the printed circuitry using roll-to-roll processes. By utilising a flexible, layered, polymer diffuser, it is possible to create uniform light output on a flexible substrate. This allows production of flexible, thin, curved, and even 3D structures with uniform light output. The polymer diffuser also exhibits protective properties meaning the overall device can be thinner than typically found in the prior art.

BRIEF DESCRIPTION OF THE DRAWINGS

FIG. 1 shows the printed pads of ACA on the first substrate.

FIG. 2 shows electronic components (in this case surface mounted LEDs) placed on the ACA pads.

FIG. 3 shows a second substrate placed on top of the components. The second substrate is coated with a thermal release adhesive.

FIG. 4 illustrates the step when the first substrate is peeled away from the rest of the materials, exposing the underside of the electronic components with associated ACA.

FIG. 5 illustrates the process of attaching the electronic components to a pre-printed circuit board by aligning the two substrates so that the electrodes of the electronic components coated with the ACA are in place above the electrodes of the printed circuit board.

FIG. 6 illustrates how the electronic components are bound to the pre-printed circuit board by applying heat and vertical pressure FIG. 7 illustrates the final processing step where the substrate is peeled away from the top of the components leaving the electronic components fixed to the circuit board.

FIG. 8 shows a section of the finished device.

DETAILED DESCRIPTION OF SPECIFIC EMBODIMENTS

Method of Construction

Figure 1:
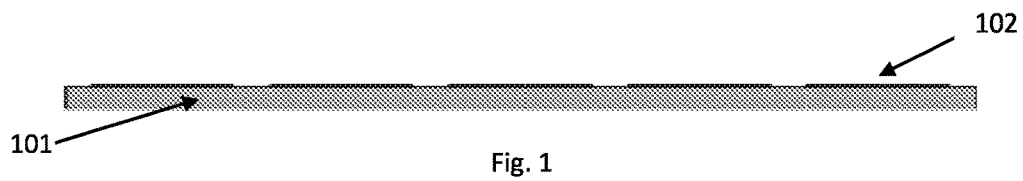
FIGS. 1-3 illustrate the steps used to create preformed arrays of surface mounted devices (SMDs) such as LEDs, resistors, capacitors and other electronic components.

The first step of the construction of the pre-configured SMD sheets shown in FIG. 1 involves printing pads of an electrically conductive adhesive 102 onto a flexible substrate 101. It is preferred that the conductive adhesive used here is an anisotropic conductive adhesive and that it is formed on the substrate 101 is such a way that it will correctly fit the electronic components to be used. It may also be preferable that a coating is applied the flexible substrate 101 to ensure that the adhesive does not adhere to the substrate so that is will be easy to later remove the flexible substrate leaving the electrically conductive adhesive mostly stuck to the contacts of the component.

Figure 2:
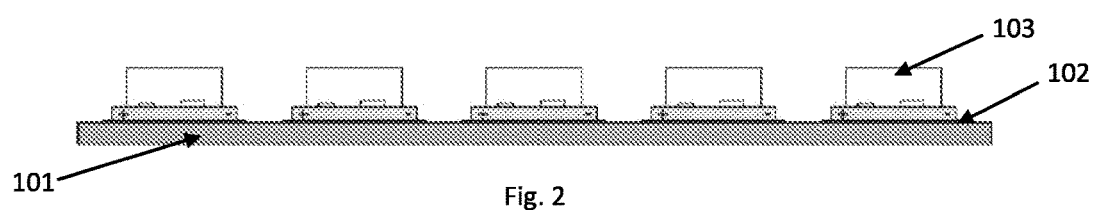
Figure 3:
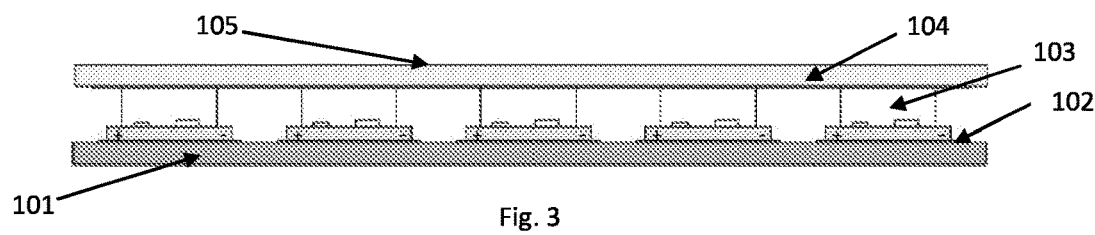

FIG. 2 shows the next step where the electronic components 103 are placed on top of the electrically conductive adhesive 102, which is already on the first substrate 101. This step is may be completed by pick and place machines or other accurate placement systems known in the art. The third step is shown in FIG. 3 where a second substrate 105, coated with an adhesive layer 104, is placed in contact with the electronic components 103, which have been placed on top of the electrically conductive adhesive 102, which is formed on the base coated substrate 101. The adhesive layer 104 is required to temporarily bind the top of the components 103 to the second substrate 105, so a thermal release adhesive may be used in this case. The resulting pre-configured SMD sheets can be stacked as sheets ready to use, or in an uncut roll ready to be cut or used in a roll-to-roll process.

Figure 4:
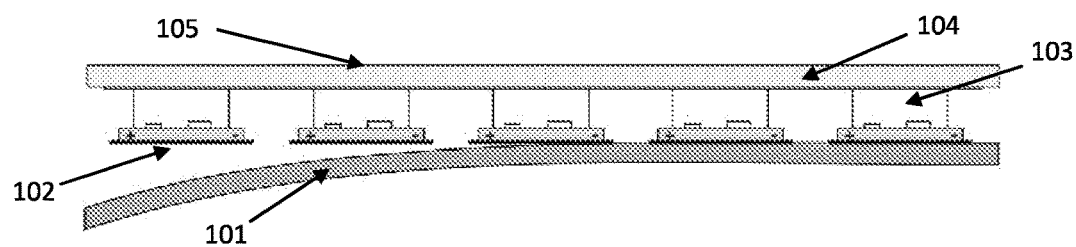
FIGS. 4 to 8 show how the pre-configured SMD sheets can be used.

To use the pre-configured SMD sheets, the initial step involves the removal of the first substrate 101 as shown in FIG. 4, exposing the underside of each electronic component 103 and the electrically conductive adhesive coating 102. The other side of the electrically conductive adhesive 102 is fixed to the electrical contacts of the component 103 and the electronic components 103 are kept in the correct location by the adhesive 104, coated on the second substrate 105.

Figure 5:
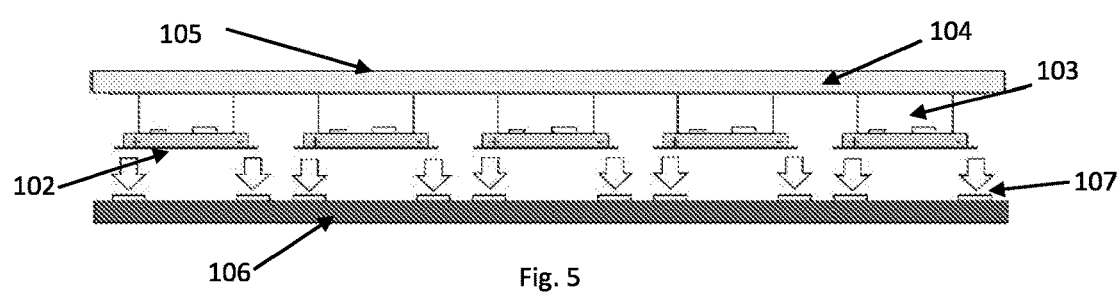
Figure 6:
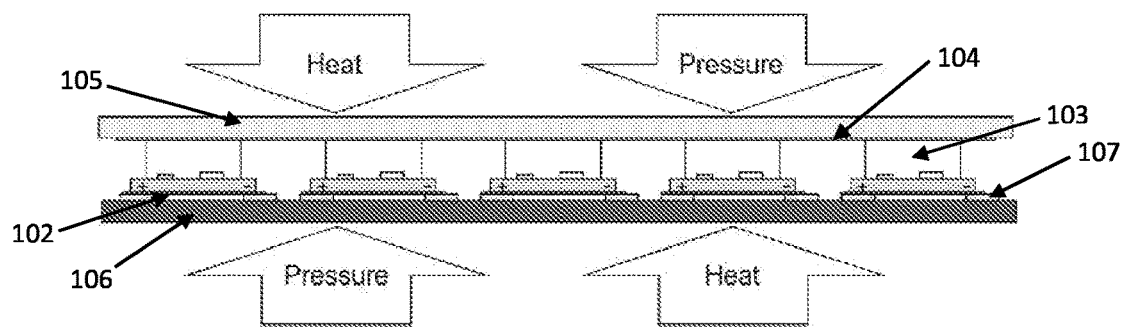
Figure 7:
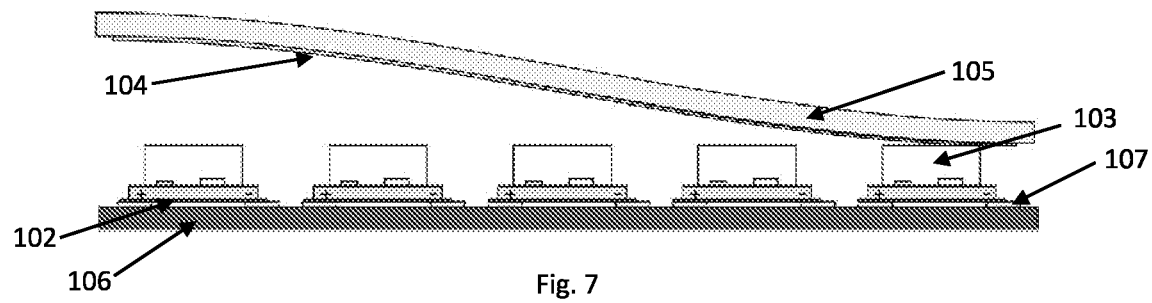

Next, the printed circuit board 106 is placed under the exposed electrically conductive adhesive 102, as shown in FIG. 5, and lined up so that the electrical contacts of the electronic components 103 are aligned with contacts 107 on the printed circuit board 106. This can be done using alignment marks, such as punched alignment holes or optical registration marks 108 on the second substrate 105, and the printed circuit board 106. Following this, heat and pressure are applied to the top and bottom surface of the printed circuit board 106, as shown in FIG. 6, pushing the electrically conductive adhesive 102 down onto the contacts of the printed circuit board 106, and up onto the electrical contacts of the electronic components 103. However, focussed light can be used in the case of an ultraviolet curing ACA. By using an ACA it is possible to coat the whole surface of the bottom of the component 103 and not just the electrodes; by doing this it is possible to ensure that the electronic components 103 are firmly adhered to the printed circuit board 106 and that there is a good electrical conductive joining between the electrodes of the electronic components 103 and the contacts 107 on the printed circuit board 106. Using an ACA means that electrical joining can only be made in the places where the electrically conductive adhesive 102 is squeezed between the contacts 107 on the printed circuit board 106, and the contacts on the electronic components 103, and not in the areas where the electrically conductive adhesive is not in contact with the electrical contacts on the electronic component 103, and the electrical contacts 106 of the circuit board 107 or in the x-axis or y-axis through the body of the conductive adhesive. In this case the electrically conductive adhesive will act as a joining material and an electrical insulator. The second substrate 105, with the adhesive coating 104, remains in place and is used to line up the sheet 105 with the circuit board 106, and also to protect the electronic components when heat and pressure is applied. Following curing the top, transparent sheet 105, with the adhesive coating 104, is removed, as shown in FIG. 7, leaving the electronic components 103 fixed to the circuit board 106, with the electrically conductive adhesive 102.

Figure 8:
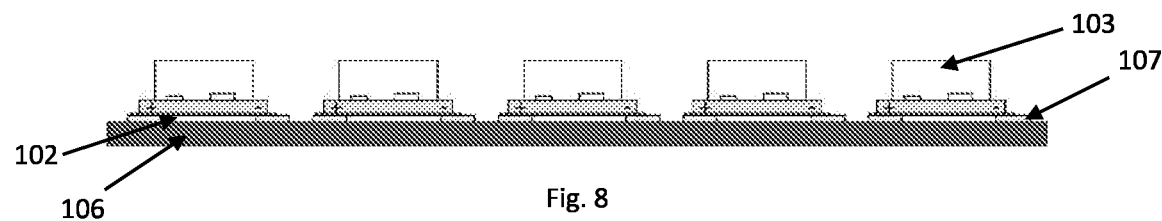
Figure 9:
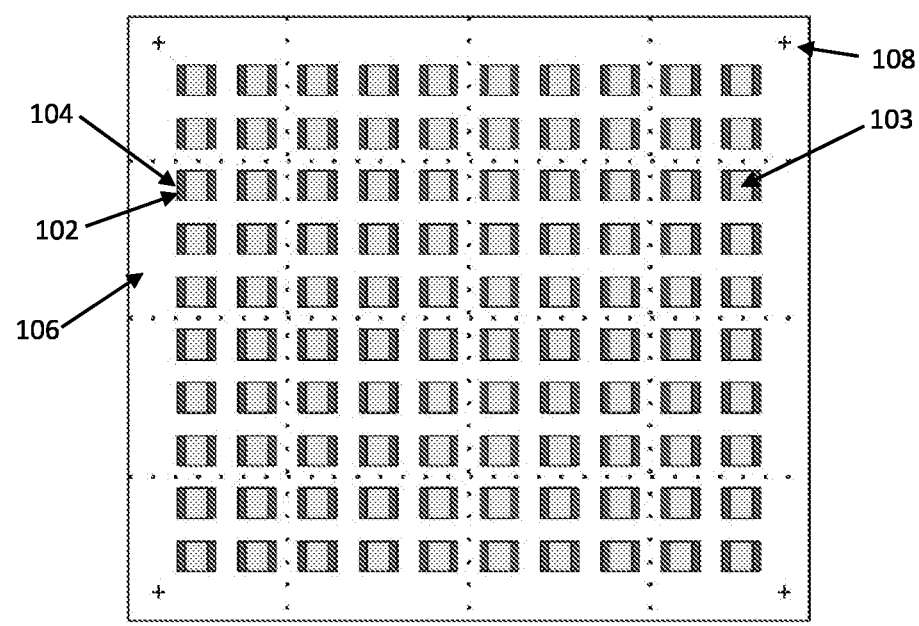
FIGS. 9-12 illustrate some of the possible pre-configured SMD sheets, but are not intended to be restrictive in any way.
Figure 10:
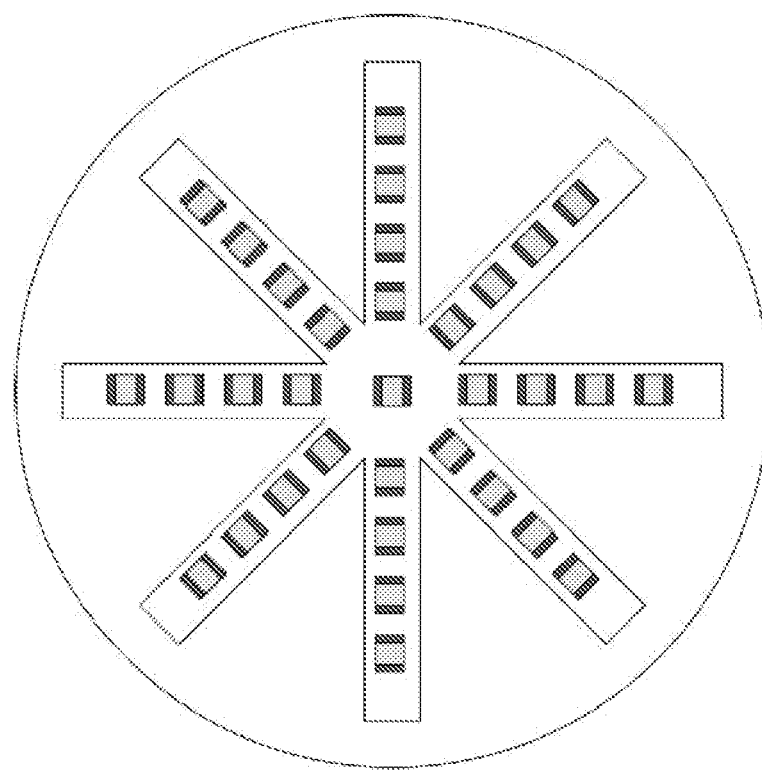
Figure 11:
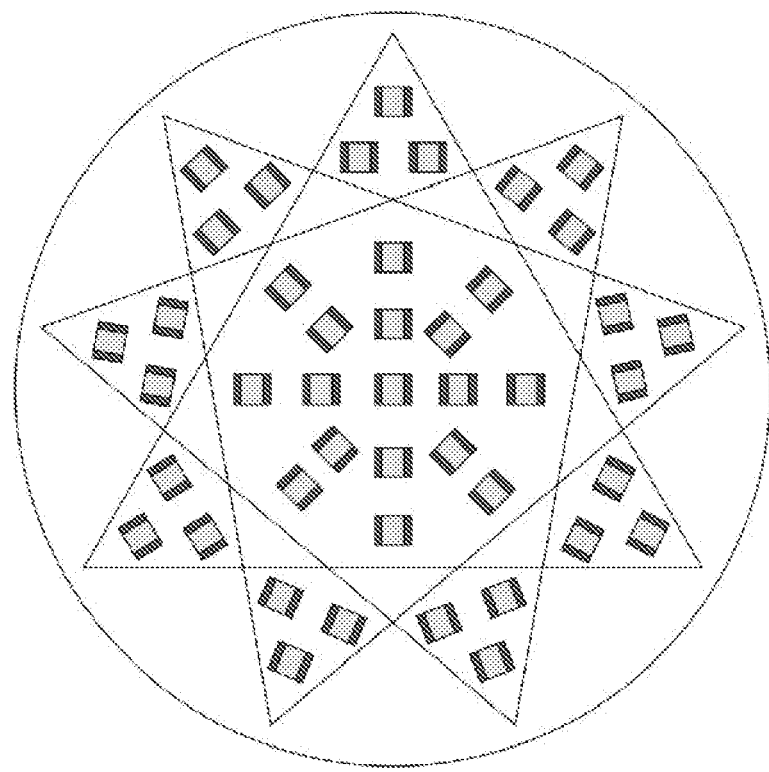
Figure 12:
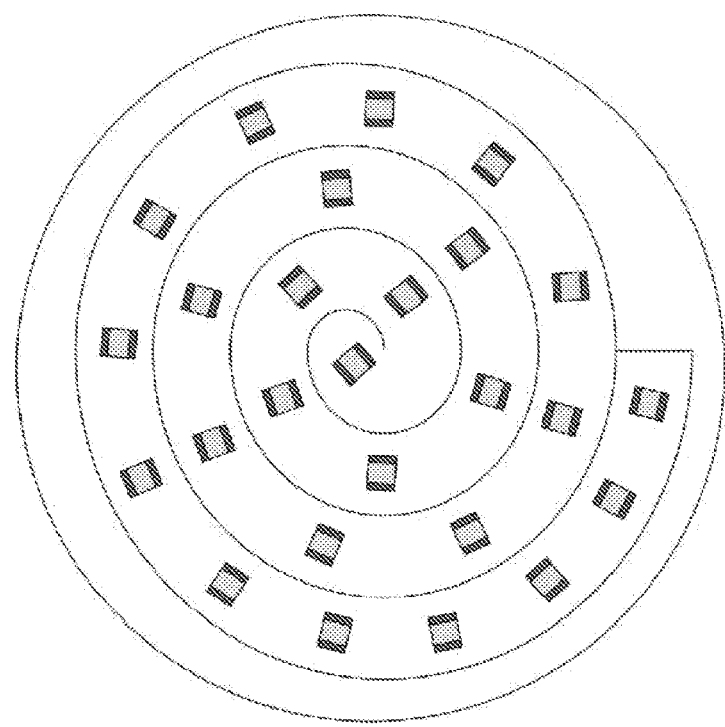

FIG. 8 shows the finished unit where the electronic components 103 are fixed to the circuit board 106, using the electrically conductive adhesive 102, providing electrically conductive connections between the contacts of the electronic components 103 and the contacts 107 on the circuit board 106.

Figure 13:
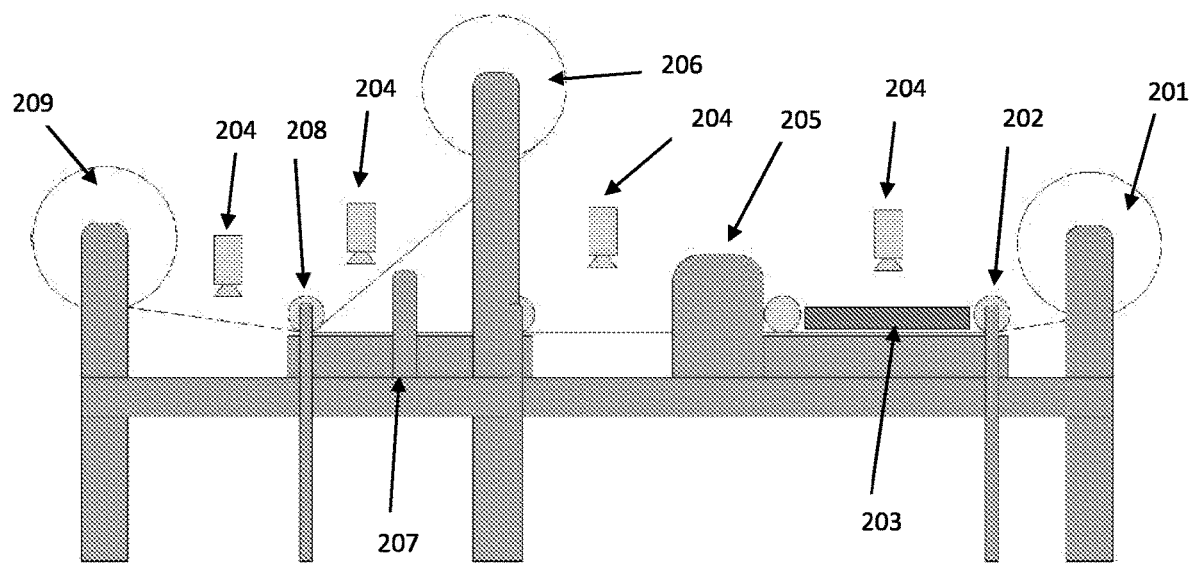
FIG. 13 illustrates a method of manufacturing the pre-configured SMD sheets in continues roll form.

Using the principles of the process highlighted above, FIG. 13 outlines a possible method for manufacturing the pre-configured SMD sheets in continuous roll form. First, a roll of the first substrate 101 coated with a non-stick coating is placed at the start of the production process. The coated first substrate 101 is passed under guide rollers 202, to ensure that it correctly enters the printing process 203. The printing process 203 then prints the conductive adhesive onto the coated substrate 101. The coated substrate 101, which has been through the printing process 203, then enters a curing process 205 and then an inspection system 204. The inspection system 204 is also used in the printing process, after the curing process, at the placement of the SMD component 103 on the printed substrate, and at the product output section. The coated substrate 101, printed with the electrically conductive adhesive, then passes into the pick and place system 207, which places the SMD components 103 onto the printed conductive adhesive 102 that have been printed in specific positions on the coated substrate 101. The second substrate 105 with the coated adhesive 106, for the top protective and positioning substrate, is then passed down through a heated pressure roller 208, at the same rate that the coated first substrate 101 passes under the same roller 208, encapsulating the SMD electronic components 103 and the conductive adhesive 102. The finished product is then rolled up after inspection 204 into a roll 209 for use in other production systems.

Figure 14:
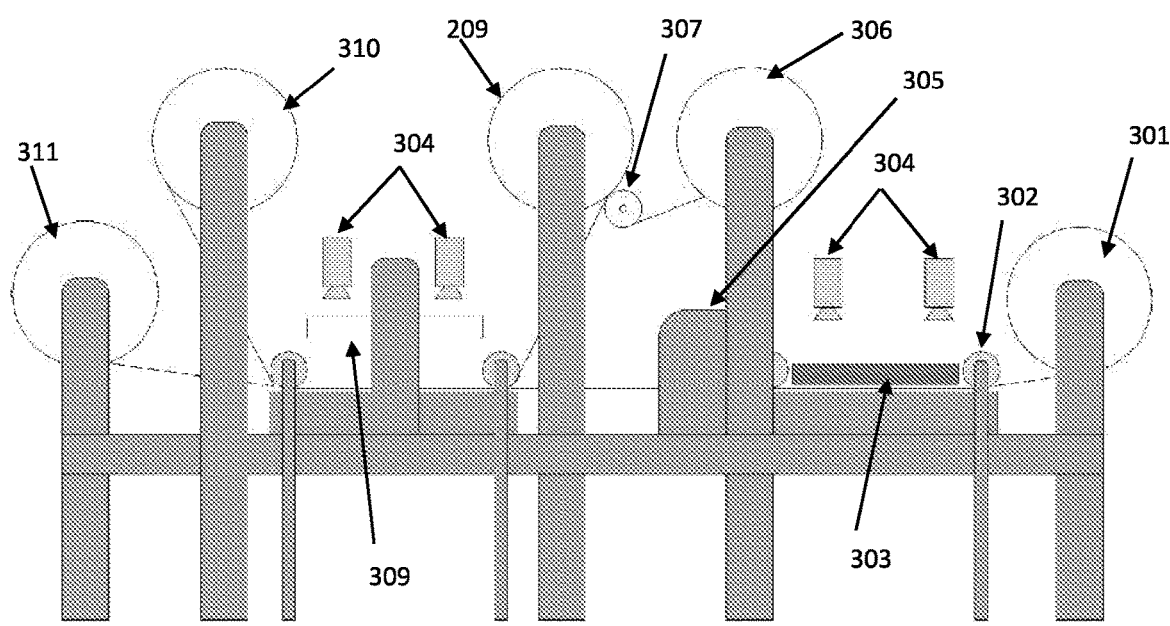
FIG. 14 illustrates a method of manufacturing devices using pre-formed SMD sheets in a roll to roll process.

Using the principles of the process outlined above, FIG. 14 outlines a possible method for manufacturing flexible devices using pre-formed SMD sheets in a roll to roll process. First the substrate 106, to be printed with the electronic circuit, is pulled from the roll by a guide roller and feed system 302. The substrate 106 is then printed with the electronic circuit by the printing mechanism 303, which is monitored by an optical system 304. The substrate 106, which has been printed using the printing mechanism 303, is then passed through a curing system 305. The roll of pre-configured SMD sheets 209 is unrolled and passed through a guide in a synchronised manner so that the pre-configured SMD sheets 209 line up with the printed electronic circuit on the substrate 106. Before the pre-configured SMD sheets are passed to the synchronisation roller and aligned with the printed electronic circuit, the protective first substrate 101 of the pre-configured SMD sheets is removed with a guide roller 307, and stored on another roller 306, for recycling later. The substrate 106 and the pre-configured SMD sheets 209 are then pressed together with pressure and heat at a press 309, to allow the conductive adhesive 102 to form electrically conductive connections and adhere the electronic components 103 to the printed electronic circuit. The protective top sheet (second substrate) 105 from the pre-formed SMD sheets is then removed to roller 310, and the completed sheets of electronic devices are then rolled up on a drum or roll 311, ready for cutting up and use.

Large Area Light Source

One application of the above process is in the production of a large area light source, particularly a uniform large area surface-mounted device (SMD) light emitting diode (LED) light source containing printed conductive tracks and electrodes.

The method of production comprises first printing the necessary power and control circuitry onto the substrate 106 using an electrically conductive printable ink. Advantageously, the conductive ink is printed using screen printing, flexographic, or other typical large volume, high speed printing techniques known to the art. The printed substrate 106 is then populated by placing LEDs 103 onto the electrodes and maintaining them in place using the electrically conductive adhesive 102, such as an isotropic conductive adhesive (ICA), anisotropic conductive adhesive (ACA), non-conductive adhesive (NCA) or a combination thereof. The adhesives used to adhere the LEDs 103 to the surface of the substrate 106 can be either pre-applied to the substrate 106 or the LED surfaces, or a combination of both. The LEDs 103 are pre-arranged with a specific orientation on a thermal release paper (second substrate) 105 before they are placed on to the electrodes 107. Once aligned with the electrodes 107 the LEDs 103 are then transferred onto the printed substrate 106 using elevated temperature to first release the thermal release paper 105 and then cure the adhesives 102 holding the LEDs 103 in place firmly.

In the case that ACA has been used, a pre-curing step might be required where the ACA is B-staged at a lower temperature before it is fully cured at a higher temperature with accompanying specific pressure applied vertically to the LED array.

Once the LED array is attached to the printed substrate 106 to form a printed device a number of further layers may be applied. These layers may include, but are not limited to, a light guide, diffuser layer, reflective layer, single or multiple interdependent lens layers, microlens array, and colour correcting layer. Such additional layers may afford uniform lighting of the required colour and colour temperature.

Figure 15:
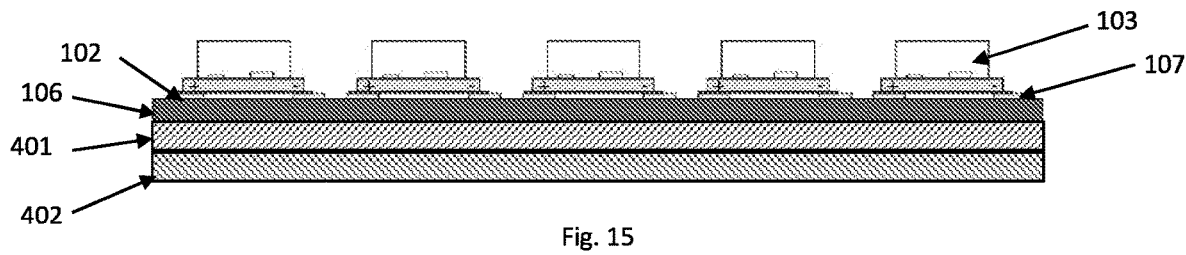
FIG. 15 shows a section of a finished device incorporating LEDs and a plurality of additional optical layers.

The completed circuit may be coated in one of multiple layers of diffusion material, as shown for example in FIG. 15. Typically a primary light guide layer 401 made from an optically clear and uncoloured flexible material such as the silicone polymer Sylgard 184, is deposited and half cured onto the substrate 106, forming a bond with the surface of the substrate 106, but still pliable enough for the next phase. An omnidirectional diffusive layer 402 is then formed on the surface of the light guide layer 401; this can be made by attaching a pre-formed diffusion sheet material or using a layer of micron scale polymeric/glass beads which might be mixed into a second silicone mixture and spread evenly on the surface of the light guide.

The complete units are then released from the roll 311 through a standard cutting mechanism, such as stamping.

Alternative Embodiments

There may be many print systems and many pre-configured SMD sheets, and many heat and pressure processes in a single production line. The production line may also include an encapsulation section.

Alternative embodiments which may be apparent to the skilled person on reading the above description may nevertheless fall within the scope of the invention, as defined by the accompanying claims.

The invention claimed is:

1. A method of connecting a plurality of electronic components to a flexible circuit board, the method comprising:
   a. providing a carrier substrate carrying the electronic components, each of the electronic components having at least one electrical contact coated with electrically conductive adhesive, wherein the electronic components are mounted on the carrier substrate by a thermal release adhesive; and
   b. applying, at a subsequent time, the carrier substrate to the flexible circuit board such that the electronic components are adhered to the flexible circuit board in electrical contact therewith via the conductive adhesive;
   wherein the step of applying the carrier substrate to the flexible circuit board includes thermally curing the conductive adhesive so as to adhere the electronic components to the flexible circuit board, thereby at the same time releasing the thermal release adhesive.

2. The method of claim 1, wherein the carrier substrate is removed after the electronic components are adhered to the flexible circuit board.

3. The method of claim 1, wherein the conductive adhesive is provided on a flexible substrate, and wherein the flexible substrate is removed before applying the carrier substrate to the flexible circuit board.

4. The method of claim 3, wherein the flexible substrate has a coating for inhibiting adhesion of the conductive adhesive thereto.

5. The method of claim 3, wherein the step of providing the carrier substrate comprises depositing the conductive adhesive onto the flexible substrate and placing the electronic components onto the conductive adhesive.

6. The method of claim 1, wherein the step of applying the carrier substrate to the flexible circuit board includes aligning the carrier substrate with the flexible circuit board using alignment marks or holes on the carrier substrate and/or the flexible circuit board.

7. The method of claim 1, wherein the conductive adhesive is an anisotropic conductive adhesive.

8. The method of claim 1, wherein the carrier substrate is provided on a continuous roll.

9. The method of claim 1, wherein the flexible circuit board is stored on a roll after the electronic components are adhered thereto.

10. The method of claim 1, wherein the electronic components comprise light-emitting diodes.

11. The method of claim 10, including applying one or more optical layers over the flexible circuit board.

12. The method of claim 11, wherein the optical layers comprise one or more of: a light guide, a diffuser layer, a reflective layer, single or multiple interdependent lens layers, a microlens array, and a colour correcting layer.

* * * * *